United States Patent [19]

Kanae

[11] 4,087,746
[45] May 2, 1978

[54] METHOD FOR DETERMINATION OF OPTICAL ANISOTROPY OF DIELECTRIC MATERIAL BY MICROWAVE

[75] Inventor: Yoshioki Kanae, Tachikawa, Japan

[73] Assignee: Agency of Industrial Science & Technology, Tokyo, Japan

[21] Appl. No.: 743,125

[22] Filed: Nov. 19, 1976

[30] Foreign Application Priority Data

Nov. 20, 1975 Japan ............................. 50-139403

[51] Int. Cl.² ............................................ G01R 27/04
[52] U.S. Cl. ............................ 324/58.5 A; 333/21 A; 356/114; 324/58.5 B
[58] Field of Search .......... 324/58.5 A, 58 A, 58.5 R, 324/58.5 B; 333/21 A; 356/114; 350/96 WG

[56] References Cited

U.S. PATENT DOCUMENTS

| | | | |
|---|---|---|---|
| 2,644,930 | 7/1953 | Luhrs et al. | 324/58.5 A |
| 2,670,649 | 3/1954 | Robinson | 324/58.5 A X |
| 2,858,512 | 10/1958 | Barnett | 333/21 A X |

FOREIGN PATENT DOCUMENTS 244,438  3/1970  U.S.S.R. ..................... 324/58.5 A

*Primary Examiner*—Stanley T. Krawczewicz
*Attorney, Agent, or Firm*—Kurt Kelman

[57] ABSTRACT

Disclosed is a method for the determination of the optical anisotropy of a dielectric material such as fibrous glass-reinforced plastic resin, particularly the measurement of the state in which reinforcing fibers present in the dielectric material are oriented, by using a microwave characterized by connecting a fixed quarter-wave plate and a rotary quarter-wave plate to a conventional reflective type microwave measuring device in front of which the dielectric material is disposed, whereby the ratio of amplitude and the phase difference which represent the degree of anisotropy of the dielectric material can be determined.

1 Claim, 16 Drawing Figures

000
METHOD FOR DETERMINATION OF OPTICAL ANISOTROPY OF DIELECTRIC MATERIAL BY MICROWAVE

BACKGROUND OF THE INVENTION

This invention relates to a method for quantifying and measuring the optical anisotropy of a dielectric material such as a fibrous glass-reinforced plastic (FRP) material by use of a microwave.

In a composite material such as FRP which is composed preponderantly of a dielectric substance, it is the orientation and quantity of reinforcing fibers present in the resin that have the greatest effect on the mechanical characteristics of the material. When FRP articles are produced by the molding methods using sheet molding and bulk molding compounds or by the spray-up method, the reinforcing fibers contained therein tend to lack uniformity in orientation.

Heretofore, FRP articles have been tested for orientation and content of reinforcing fibers by destructive inspection based on combustion, decomposition, etc. Thus, establishment of a method for non-destructive inspection has been desired.

It is an object of this invention to provide a method for measuring the optical anisotropy of an opaque dielectric material such as an FRP article without necessitating destruction of the article.

SUMMARY OF THE INVENTION

To attain the object described above according to the present invention, there is provided a method for the determination of the optical anisotropy of a dielectric material by means of a microwave, which method comprises producing a linearly polarized microwave by means of a microwave generator, converting said linearly polarized microwave into a circularly polarized wave with a fixed quarter-wave plate, causing said circularly polarized wave to impinge in the form of a linearly polarized wave upon a test specimen by means of a rotary quarter-wave plate, adjusting said plate in inclination so as to bring the inclination thereof into perfect agreement with the inclination of the major axis of an elliptically polarized wave generated during its passage through the test specimen for thereby converting said elliptically polarized wave into a resultant linearly polarized wave, measuring standing waves in two components of the linearly polarized waves, and consequently determining the inclination and the ellipticity of said elliptically polarized wave thereof on the basis of the measurement of the standing waves and the angle of said rotary quarter-wave plate.

According to the present invention, the ratio of amplitude and the phase difference which represent the degree of anisotropy of the test specimen can easily be determined by finding the inclination of the elliptically polarized wave generated by the linearly polarized wave during its passage through the test specimen and the ellipticity of said elliptically polarized wave as described above. The actual determination by this method can easily be accomplished by placing a polarized microwave measuring device on the outside of a given FRP article, applying a metal plate such as of aluminum foil on the corresponding back side of said article causing generation and reflection of the microwave. Unlike the conventional method, this determination can be accomplished without necessitating any destruction of the article under test.

The other objects and characteristics of the present invention will become apparent from the description to be given in detail hereinbelow with reference to the accompanying drawing.

DESCRIPTION OF THE PREFERRED EMBODIMENTS

Figure 1:
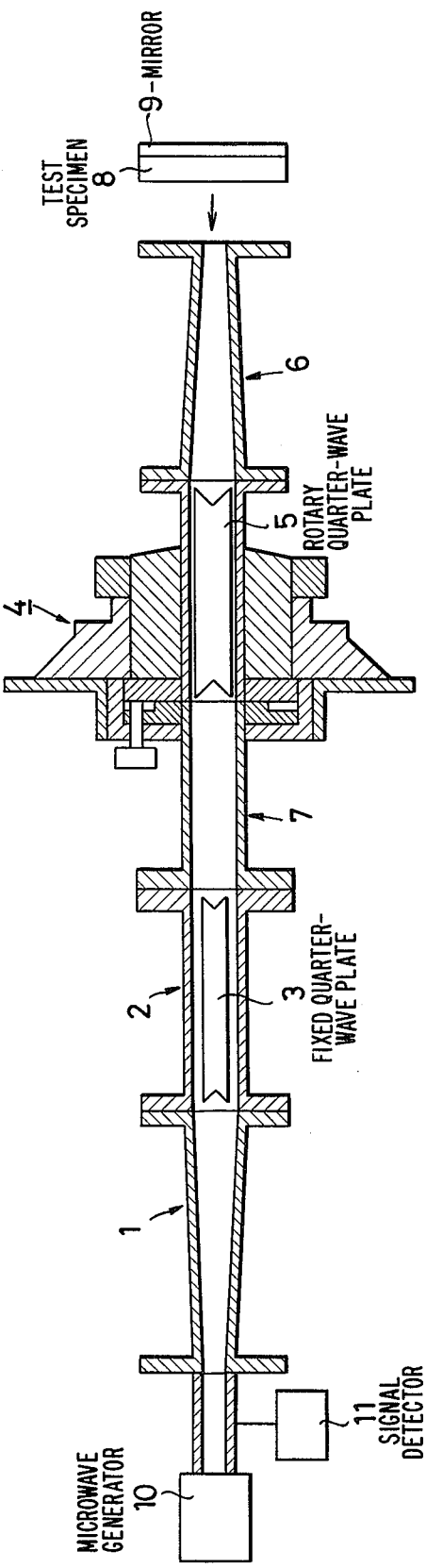
FIG. 1 is a cross section of one preferred embodiment of the apparatus used for practicing the method of this invention.

FIG. 1 illustrates one preferred embodiment of the apparatus to be used for practicing the method of this invention. A Δ90° differential phase section 2 comprising a quarter-wave plate 3 fixed in a circular waveguide and a rotary differential phase section 4 comprising a quarter-wave plate 5 rotatable up to an angle of at least 180° around the axis of the waveguide are connected through a circular waveguide 7. To the anterior face of the Δ90° differential phase section 2 are connected an input section 1, a microwave generator 10 and a signal detector 11. To the posterior face of the rotary differential phase section 4 is connected an output section 6 which is provided at the tail end thereof with a horn or antenna properly tuned to free space and possessed of high directivity. The test specimen 8 is placed in the free space in front of the horn or antenna with a reflecting mirror 9 attached fast to the rear face thereof.

Ordinary combination circular-circular waveguides can be used as the input section 1 and the output section 6. Alternatively combination rectangular-circular waveguides (namely, $TE_{10}$-$TE_{11}$ mode converters) may be used. The quarterwave plate 3 which is incorporated in the Δ90° differential phase section 2 is formed of a dielectric vane involving less absorption of wave and is fixed in position at an angle of 45° relative to the plane including the linearly polarized microwave from the generator 10. A quarter-wave plate 5 identical with said quarter-wave plate 3 is provided inside the rotary differential phase section 4. Said quarter-wave plate 5 has a structure such that it is rotatable up to an angle of at least 180° around the axis of the waveguide and it permits reading of the angle of said plane of the polarized microwave. The reflecting mirror 9 which is fastened to the rear face of the test specimen 8 can be made of a substance such as aluminum foil which is capable of reflecting microwaves.

Now the specific method by which a given dielectric article is tested for its optical anisotropy with the apparatus of the aforementioned construction will be described.

Figure 2:
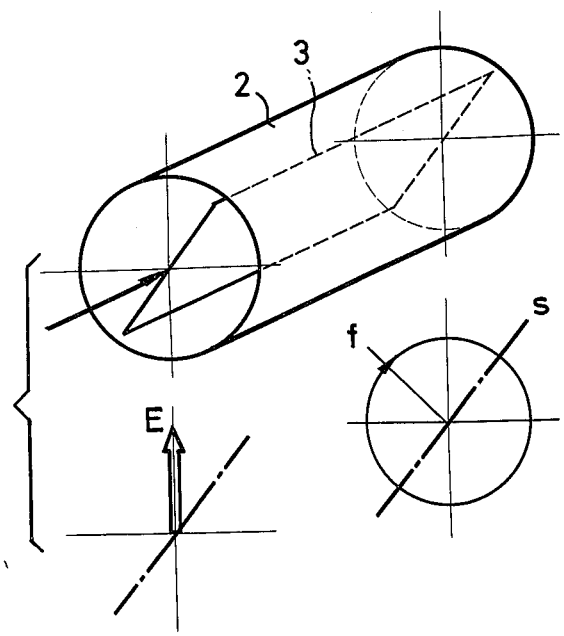
FIG. 2 is an explanatory diagram illustrating the state in which a linearly polarized microwave is converted by a fixed quarter-wave plate into a circularly polarized wave.
Figure 3A:
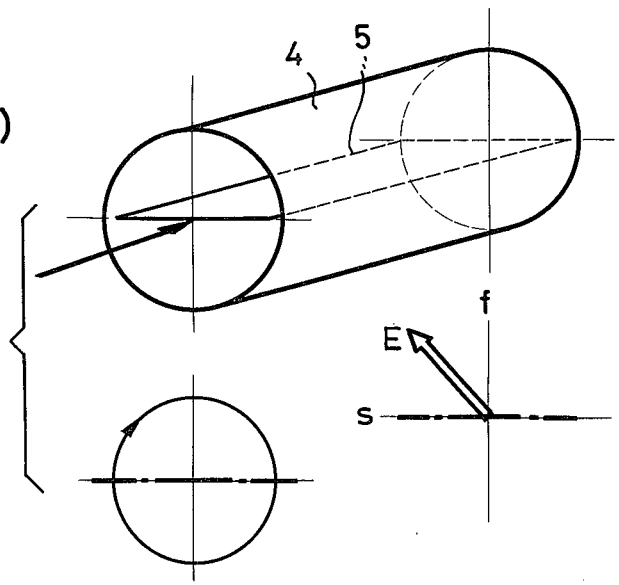
FIGS. 3(A) and 3(B) are explanatory diagrams illustrating the state in which a circularly polarized wave is converted by a rotary quarter-wave plate into a linearly polarized wave.
Figure 3B:
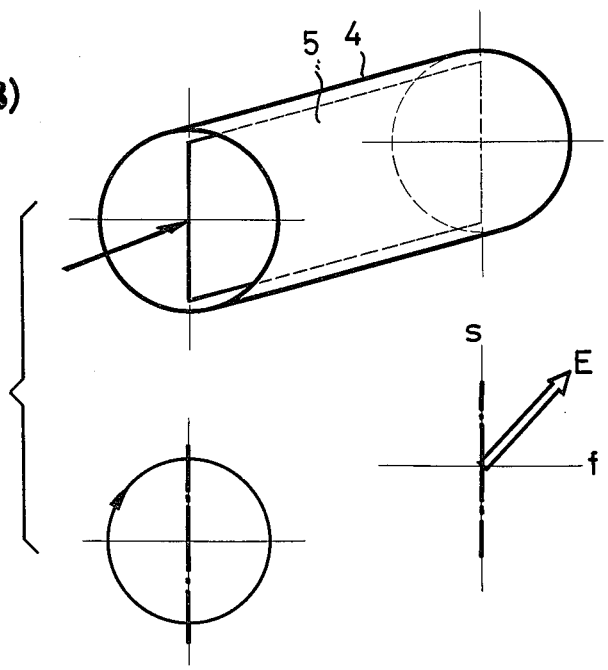

The microwave which is produced by the microwave generator 10 is in the $TE_{10}$ mode if the generator section is formed of a rectangular waveguide, and therefore, it is necessary to use at the joint with the Δ90° differential phase section 2 a converter adapted to convert said $TE_{10}$ mode into the $TE_{11}$ mode. At the Δ90° differential phase section 2, the electric-field vector E of the linearly polarized wave is converted into a circularly polarized wave by means of the fixed quarter-wave plate 3 (FIG. 2). The circularly polarized wave thus produced is then passed through the rotary quarter-wave plate 5 disposed inside the rotary differential phase section 4, so that the plate converts said wave into a linearly polarized wave falling in a plane inclined by 45° relative to the plate 5, no matter whether said plate 5 is positioned at 0° (FIG. 3(A)) or at 90° (FIG. 3(B)).

The linearly polarized wave advances through the output section 6, reaches the test specimen 8 held in the free space after passage through the antenna, penetrates the test specimen, then impinges upon the reflecting mirror 9 held fast to the rear surface of the test specimen, is immediately reflected by the surface of said reflecting mirror, again passes through the test specimen and returns to the output section 16 through the antenna.

Figure 4A:
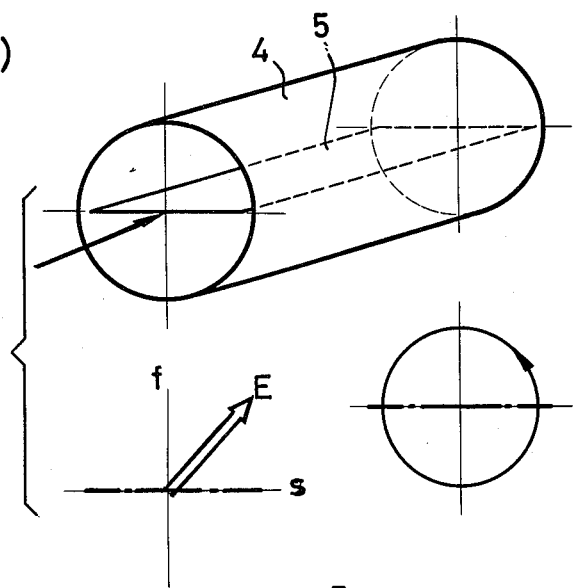
FIGS. 4(A) and 4(B) and 5(A) and 5(B) are explanatory diagrams illustrating the state in which a circularly polarized wave is converted by a rotary quarter-wave plate and a fixed quarter-wave plate into a linearly polarized wave.

If the test specimen is optically isotropic and does not give rise to double refraction, then the microwave in its unaltered linearly polarized form makes a return trip through the test specimen and reaches the waveguide. While passing through the rotary differential phase section 4, this linearly polarized microwave is converted by the quarter-wave plate 5 into a circularly polarized wave having rotation opposite to that of the initial circularly polarized wave (relative to the direction of the wave's progress). This wave, when further passed through the quarter-wave plate 3 disposed within the Δ90° differential phase section 2, is finally converted into a linearly polarized wave (FIGS. 4 and 5).

The total of the phase difference produced in said return trip is brought to $\pi$ radian owing to the function of the quarter-wave plate 3 within the Δ 90° differential phase section 2. At the quarter-wave plate 5 disposed within the rotary differential phase section 4, the total of the phase difference produced in the return trip can be varied in the range of from 0 to $2\pi$ radian by changing the angle of said plate relative to the polarized plane of the generated microwave.

Figure 4B:
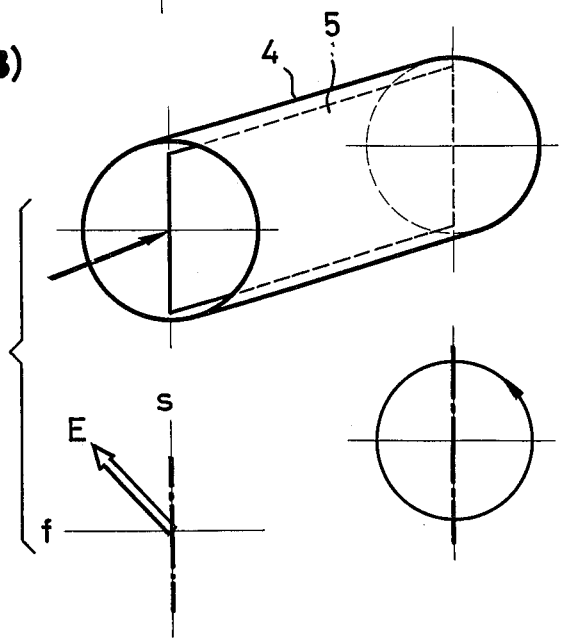
Figure 5A:
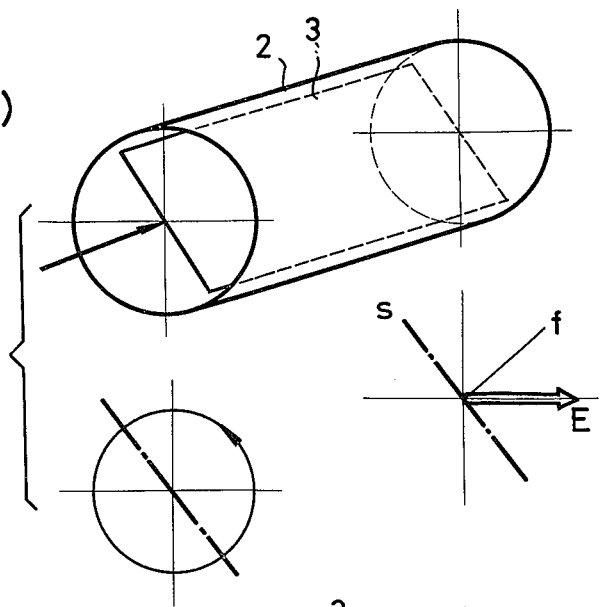
Figure 5B:
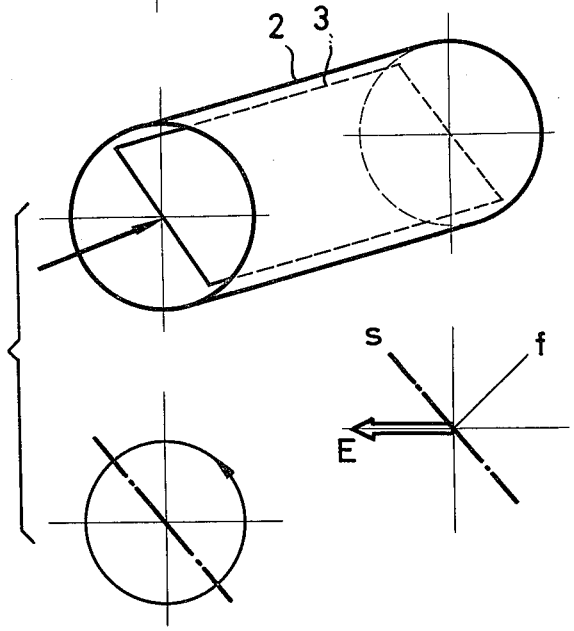
Figure 7A:
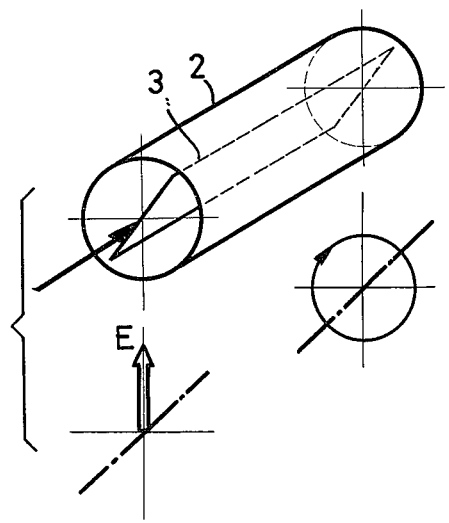
FIGS. 7(A), 7(B) and 7(C) and 8(A), 8(B) and 8(C) are explanatory diagrams illustrating a method for determining the inclination and the ellipticity of an elliptically polarized wave from the test specimen.
Figure 7B:
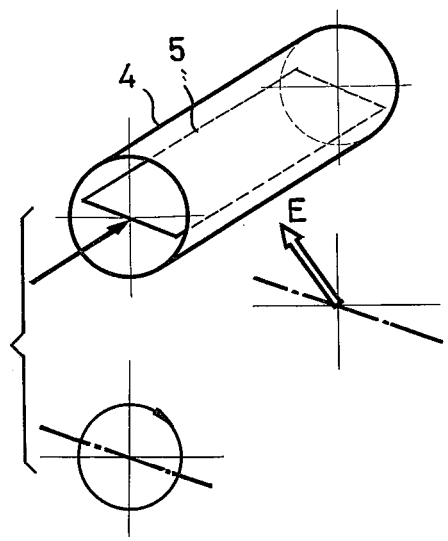
Figure 7C:
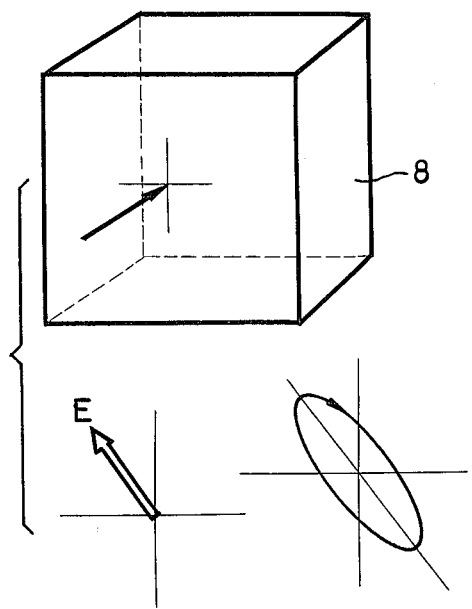
Figure 8A:
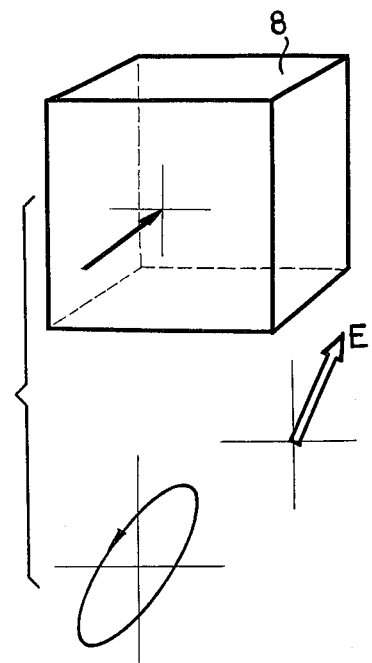
Figure 8B:
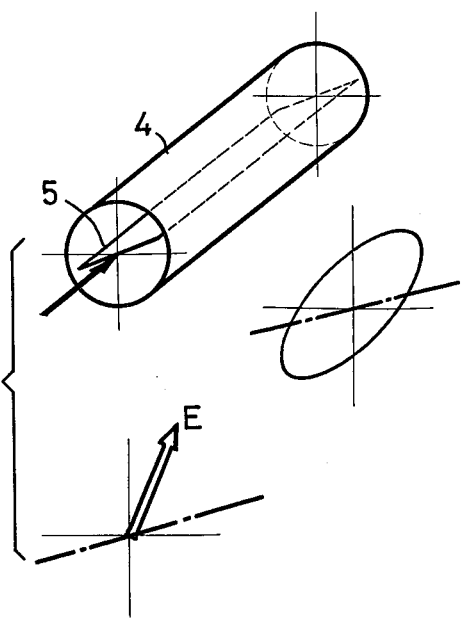
Figure 8C:
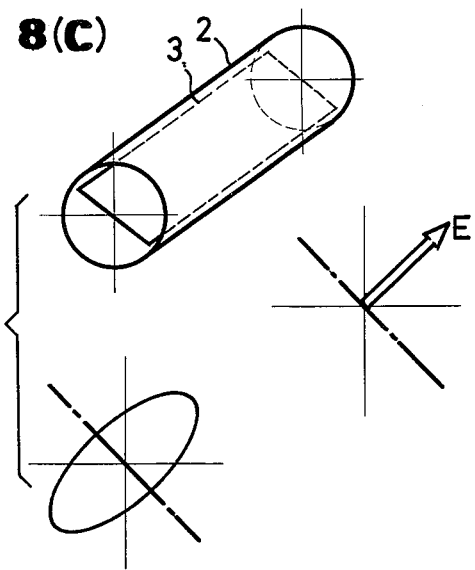

The overall phase difference Δ, as is evident from FIG. 4(B) and FIG. 5(B), is $\pi$ radian when the angle of the quarter-wave plate 5 within the rotary differential phase section 4 is 0° and $3\pi$ radian when said angle is 90°. The rotation of the electric-field vector between the input wave and the output wave is 90° where the angle of the quarter-wave plate 5 is 0°, and 270° where said angle is 90°. In either case, the plane of the final linearly polarized wave perpendicularly intersects the plane of polarization of the input wave and, therefore, does not produce any standing wave.

Figure 6A:
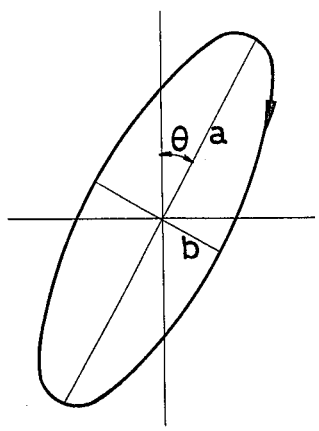
FIGS. 6(A) and 6(B) are explanatory diagram illustrating a method for effecting required correction of an elliptically polarized wave from the test specimen.

If the test specimen is optically isotropic and gives rise to double refraction of the microwave, then the wave which has passed through the test specimen is generally in an elliptically polarized form as illustrated in FIG. 6(A). Ordinarily, the major axis of the elliptic form of polarization of the wave is inclined by a certain angle relative to the incident polarized wave to the test specimen. The elliptically polarized wave thus produced, therefore, can be converted finally into a linearly polarized wave by making the angle of rotation of the quarter-wave plate 5 within the rotary differential phase section 4 precisely equal to the inclination $\theta$ of said major axis of the ellipse. The inclination $\theta$ of the elliptically polarized wave can be found by reading out the angle of rotation of the quarter-wave plate 5. The processes described above are diagrammatically depicted in FIG. 7(A) through (C) and FIG. 8(A) through (C).

Figure 6B:
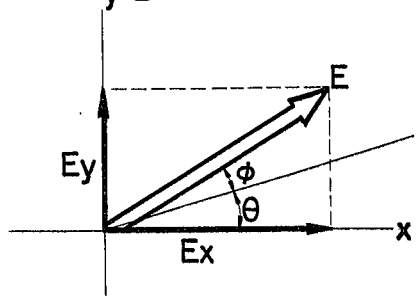

In the final linearly polarized wave, the inclination is further incremented, as illustrated in FIG. 6(B), by the ellipticity $\phi$ (wherein, $\phi$ stands for a value that satisfies the expression: $a/b = \tan \phi$). It can be calculated from the following equation by using the actually measured values $E_x$ and $E_y$ of the two components $x$ and $y$ of the linearly polarized wave (one of the components being a component having the same plane of polarization as that of the generated wave and the other being a component having a plane perpendicularly intersecting said plane of polarization) and the value of $\theta$ already measured.

$$\frac{E_y}{E_x} = \frac{E \sin (\theta + \phi)}{E \cos (\theta + \phi)} = \tan (\theta + \phi)$$

$$\therefore \phi = \tan^{-1}\left(\frac{E_y}{E_x}\right) - \theta$$

Since $E_x$ and $E_y$ perpendicularly intersect each other, one of the two values can easily be obtained by measuring the amplitude of the standing wave which occurs when the rotation is made by 90° from the position of the test specimen around the axis of the waveguide.

The two quantities, amplitude ratio $\gamma$ and phase difference Δ, which represent the degree of the anisotropy of the test specimen can be calculated from the following equations by using the ellipticity and the inclination of the elliptically polarized wave.

$$\tan \Delta = \mp \frac{\tan 2\phi}{\sin 2\phi}$$

$$\cos 2\gamma = \cos 2\phi \cdot \cos 2\theta$$

In the first of the foregoing two equations, the meaning of the minus-or-plus symbol is that the minus portion applies to the counterclockwise rotation of the elliptic polarization and the plus portion to the clockwise rotation thereof.

In a special case of the aforementioned method of determination, $\theta = 0$ can occur. This case occurs when the angle of the rotary quarter-wave plate 5 is fixed at 0° and the test specimen and the reflecting mirror are rotated around the axis of the waveguide. In this particular case, the ellipticity $\phi$ can be calculated by measuring the maximum and minimum values of the amplitude of the wave. The determination, in this case, can be performed with ease and with improved accuracy.

Since the method of this invention permits the ratio of amplitude and the phase difference which represent the degree of anisotropy of a dielectric article to be easily determined by use of a microwave as described above, it provides an easy non-destructive inspection method effective and advantageous for use with bathtubs, automobile bodies, motorboat hulls and other articles molded of FRP.

What is claimed is:

1. A method for the determination of the optical anisotropy of a dielectric material by means of a microwave, which method comprises producing a linearly polarized microwave by means of a microwave generator, converting said linearly polarized microwave into a circularly polarized wave with a fixed quarter-wave plate, causing said circularly polarized wave to impinge in the form of a linearly polarized wave upon a test specimen by means of a rotary quarter-wave plate, adjusting said plate in inclination so as to bring the inclination thereof into perfect agreement with the inclination of the major axis of an elliptically polarized wave generated during its passage through the test specimen for thereby converting said elliptically polarized wave into a resultant linearly polarized wave, measuring standing waves in two components of the linearly polarized waves, and consequently determining the inclination and the ellipticity of said elliptically polarized wave thereof on the basis of the measurement of the standing waves and the angle of said rotary quarter-wave plate.

* * * * *